United States Patent
Philippens

(10) Patent No.: US 7,672,353 B2
(45) Date of Patent: Mar. 2, 2010

(54) SEMICONDUCTOR LASER DEVICE AND METHOD FOR ITS PRODUCTION

(75) Inventor: Marc Philippens, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 181 days.

(21) Appl. No.: 11/861,679

(22) Filed: Sep. 26, 2007

(65) Prior Publication Data

US 2008/0089379 A1    Apr. 17, 2008

(30) Foreign Application Priority Data

Sep. 27, 2006  (DE) ............. 10 2006 045 706
Jan. 16, 2007  (DE) ............. 10 2007 002 303

(51) Int. Cl.
*H01S 5/00* (2006.01)
*H01S 3/091* (2006.01)

(52) U.S. Cl. .................. 372/50.124; 372/70

(58) Field of Classification Search ........... 372/50.1, 372/50.124, 39, 70, 50.12, 50.121; 438/29
See application file for complete search history.

(56) References Cited

U.S. PATENT DOCUMENTS

| 5,796,771 | A   |   | 8/1998  | DenBaars et al. |
| 6,330,262 | B1  |   | 12/2001 | Burrows et al. |
| 6,876,684 | B2  | * | 4/2005  | Kahen et al. .......... 372/39 |
| 6,954,479 | B2  |   | 10/2005 | Albrecht et al. |
| 7,570,682 | B2  |   | 8/2009  | Albrecht et al. |
| 2002/0001328 | A1 |   | 1/2002 | Albrecht et al. |
| 2004/0042523 | A1 | * | 3/2004 | Albrecht et al. ........... 372/70 |
| 2004/0076201 | A1 |   | 4/2004 | Spoonhower et al. |
| 2005/0062903 | A1 |   | 3/2005 | Cok et al. |
| 2005/0226302 | A1 | * | 10/2005 | Lutgen ............. 372/70 |

FOREIGN PATENT DOCUMENTS

| DE | 100 26 734      | 12/2001 |
| DE | 102 23 540 A1   | 12/2003 |
| EP | 0 795 941 A1    | 9/1997  |
| EP | 1 220 392 A2    | 12/2001 |
| EP | 1 411 607 A2    | 4/2004  |
| EP | 1 641 092       | 3/2006  |
| JP | 2001-189527 A   | 7/2001  |
| WO | WO 01/93386 A1  | 12/2001 |
| WO | WO 03/094311 A2 | 11/2003 |
| WO | WO 2005/048424 A1 | 5/2005 |

OTHER PUBLICATIONS

Michael D. Gerhold et al., "Novel Design of a Hybrid-Cavity Surface-Emitting Laser", Mar. 1998, IEEE Journal of Quantum Electronics, vol. 34, No. 3, pp. 506-511.

* cited by examiner

*Primary Examiner*—Armando Rodriguez
(74) *Attorney, Agent, or Firm*—Fish & Richardson P.C.

(57) ABSTRACT

A semiconductor laser device has an optically pumped, surface-emitting vertical emitter with a radiation-generating vertical emitter zone comprising a layer containing an organic material and a monolithically integrated pump radiation source for the optical pumping of the vertical emitter. The pump radiation source is designed to emit pump radiation in a main radiation direction transverse to the main radiation direction of the vertical emitter.

20 Claims, 2 Drawing Sheets

SEMICONDUCTOR LASER DEVICE AND METHOD FOR ITS PRODUCTION

BACKGROUND

The invention pertains to a semiconductor laser device.

A radiation pump can be used to pump energy into laser gain medium. The energy can be in the form of light energy. The energy is used to raise electrons in an atom or molecule of the gain medium from a lower energy level to a higher energy level. Once there is a sufficient amount of electrons in an excited state, the medium can act as a laser or amplifier.

SUMMARY

Optically pumped vertically emitting semiconductor laser devices provide high output energy and good quality radiation at the same time. Monolithically integrated pump radiation sources can provide a compact configuration.

In one embodiment, a semiconductor laser device is described, which may be manufactured to generate different wavelengths of laser radiation. Also described is an advantageous method for its manufacture.

According to a first aspect of the devices described herein, a semiconductor laser device has an optically pumped, surface-emitting vertical emitter with a radiation-generating vertical emitter zone. The device also has a monolithically integrated pump radiation source for the optical pumping of the vertical emitter. The pump radiation source for the emission of the pump radiation acts in a main radiation direction transverse to the main direction of the vertical radiation of the vertical emitter. One feature of the semiconductor laser device is that the vertical emitter has at least one layer containing an organic material.

The group of organic materials that are suitable for use with the laser device includes a large number of organic substances characterized by a wide bandwidth of different optical and electrical properties, including their energetic band gap. By selecting suitable substances for at least one layer of the vertical emitter, the optical properties of the vertical emitter, e.g. the wavelength, of the vertical radiation can be adjusted as desired within broad limits. In contrast to inorganic semiconductor materials, organic materials can be applied to the substrate by relatively simple methods, e.g. thermal evaporation or spincasting of a solution.

In some embodiments of the semiconductor laser device, the organic material generates radiation and is part of the vertical emitter zone. This allows the optical properties of the vertical emitter to vary within broad limits based on the selection of organic material.

In some embodiments of the semiconductor laser device, the organic material is semi-conductive. This allows active layers or charge-carrier-injecting layers to be formed and applied using the above-described relatively simple methods.

In some embodiments of the semiconductor laser device, the vertical emitter zone is vertically aligned with an internal resonator mirror, such as a Bragg reflector. The mirror allows the vertical radiation to either be emitted from a side of the vertical emitter zone opposite the substrate, i.e., if the internal resonator mirror is located between the vertical emitter zone and the substrate, or through the substrate if the internal resonator mirror is configured on top of both the substrate and the vertical emitter zone. In the latter case, a window may be included for the transmission of radiation that is generated by the vertical emitter zone.

In some embodiments of the semiconductor laser device, the vertical emitter zone is equipped with an external reflector which, together with the internal resonator mirror, forms a resonator for the vertical emitter. Alternatively, the design includes one additional internal resonator mirror. This additional internal resonator mirror and the internal resonator mirror enclose the vertical emitter zone in vertical direction thus forming a resonator for the vertical radiation. The additional internal resonator mirror is semi-transparent and used for releasing the vertical radiation and allowing for a compact design for the internal resonator. An external resonator provides high resonator quality and an accordingly narrow spectrum of vertical radiation.

In some embodiments of the semiconductor laser device, the pump radiation source is an edge-emitting laser. At least two pump radiation sources are on opposite sides of the vertical emitter, wherein the two pump radiation sources have a common resonator and together form the laser.

In some embodiments of the semiconductor laser, the pump radiation source exhibits an active, radiation-generating pumping layer. The pumping layer either at least partially overlaps the active vertical emitter zone or is vertically configured in line with or upstream from the active vertical emitter zone. As used herein, upstream means in the direction of the vertically emitted laser radiation. Accordingly downstream refers to the opposite direction.

In some embodiments of the semiconductor laser device, the pump radiation source has a sequence of layers based on III-V or II-VI semiconductors or has a layer containing a semi-conductive organic material. In the latter case, the semi-conductive organic material of the pump radiation source is a polymer or a low-molecule weight organic compound, also referred to as a small molecule compound. Small molecules are generally not polymers. A polymer can make up the semi-conductive organic material of the layer of the vertical emitter. In embodiments the semi-conductive organic material is a low-molecular weight organic compound. Polymer layers can be produced on a large scale by spincasting a solution, for example.

In some embodiments of the semiconductor laser device, the wavelength of the pump radiation is smaller than the wavelength of the vertical radiation. This allows for optical pumping.

In some embodiments of the semiconductor laser device, the device includes at least two vertical emitters, whose vertical radiations have different wavelengths. Multiple vertical emitters can be placed in a uniform configuration. This allows for display units and units with a floodlight effect.

According to a second aspect of the invention, a method for the manufacture of a semiconductor device of this type includes the following steps: supply of a substrate, to which a series of epitaxial layers is applied, wherein the sequence of epitaxial layers includes a radiation-generating layer, which is used as pump radiation source. Furthermore, a recess is created inside the sequence of epitaxial layers, into which a series of layers is applied, and which exhibits at least one layer containing an organic material, and wherein the sequence of layers is suited to form a vertical emitter.

In some embodiments of the method for the manufacture of a semiconductor laser device, the radiation-generating layer applied to the recess inside the series of epitaxial layers is or includes organic material.

In another embodiment of the method, the step of forming at least one recess includes an etching step or is performed by masking the substrate while the sequence of epitaxial layers is applied.

BRIEF DESCRIPTION OF THE FIGURES

In the following, the invention will be explained in greater detail based on embodiments represented in four figures. They are as follows.

The figures are for illustration purposes only. Especially the dimensions of the elements and the thicknesses of the layers are not represented true to scale.

DETAILED DESCRIPTION

Figure 1:
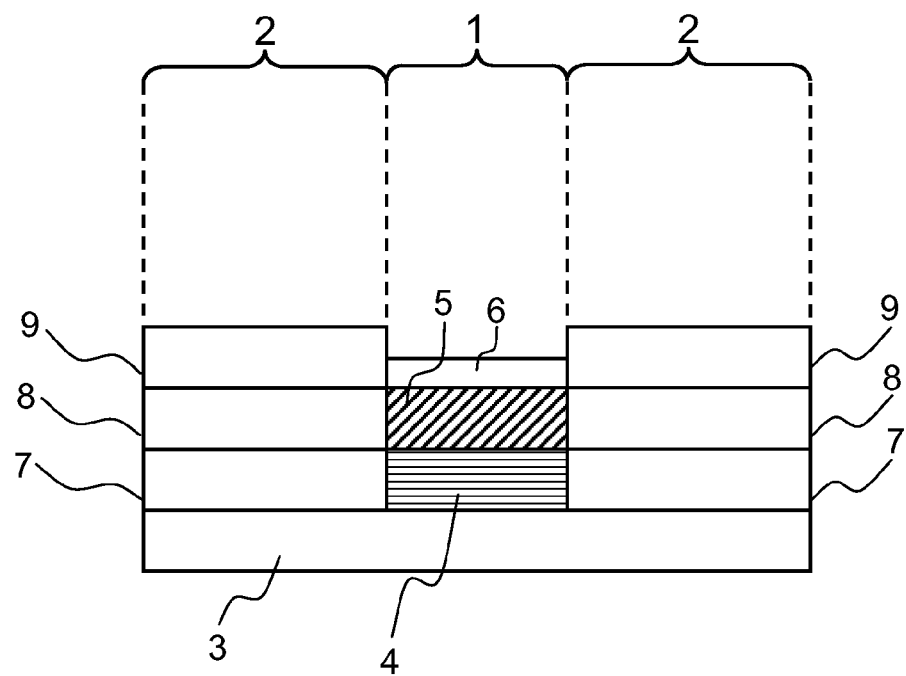
FIG. 1 shows a cross section of an embodiment of a semiconductor laser device.

Referring to FIG. 1, a cross-sectional view of an embodiment of a semiconductor laser device shows a central vertical emitter 1 and two pump radiation sources 2 located on opposite sides of the emitter 1, where the two pump radiation sources 2 and the emitter 1 are laterally adjacent to one another. The vertical emitter 1 and the pump radiation sources 2 are grown on a single substrate 3. A Bragg reflector 4 is attached to the area of the substrate 3 where the vertical emitter 1 is located. Configured on this reflector is an active vertical emitter zone 5 to which a top layer 6 has been applied. At the pump radiation sources 2, one p-sided sequence of layers 7 each is configured on the substrate 3, followed by an active pump radiation layer 8 as well as an n-sided layer sequence 9.

The embodiment in FIG. 1 shows a semiconductor laser device, where an organic vertical emitter 1 is pumped by the inorganic pump radiation sources 2. The classification of the vertical emitter 1 as organic indicates that at least one the layers of the vertical emitter 1 contains organic material. In particular, this is an optically active layer in the vertical emitter zone 5. The alternative classification of the pump radiation sources 2 as inorganic indicates that the pump radiation sources 2 generally contain inorganic layers. The pump radiation sources 2 may be implemented based on a III-V semiconductor material system and may have layers of a composition such as $In_xAl_yGa_{1-x-y}N$, $In_xAl_yGa_{1-x-y}As$, $In_xAl_yGa_{1-x-y}P$, or $In_xGa_{1-x}As_yN_{1-y}$ with $0 \leq x \leq 1$, $0 \leq y \leq 1$, $0 \leq x+y \leq 1$. The pump radiation sources are, of course, not limited to this material system but may also be implemented according to desired wavelength, or other requirements based on other semiconductor material systems, e.g., based on a II-VI semiconductor material system.

In the embodiment shown, the pump radiation sources 2 are designed as edge-emitting pump lasers, whose laser-active medium is the active pump layer 8. The outer sides of the pump radiation layers 8 are reflective so that the two pump radiation layers 8 of the pump radiation source 2 together with the vertical emitter zone 5 form a joint resonator for the pump radiation. The ends of the pump radiation layer 8 can be made reflective by vapor-application of a highly reflective metal coating. In place of or in combination with the reflective surface, the resonator for the pump radiation can also be created by structuring of the outer sides of the pump radiation layer 8 if the structuring achieves total reflection at an inner boundary of the pump radiation layer 8. Such structuring may be achieved by shaping the ends of the pump radiation layer as prism retro-reflectors, for example. The structuring or reflective surface can be on edges of the source 2 that are not adjacent to the emitter 1.

The p-sided sequence of layers 7 and the n-sided sequence of layers 9 are on the opposite ends of the pump radiation layer 8 in a vertical direction and are used to supply charge carriers, which recombine to form radiation within the pump radiation layer 8, and act as a wave guide for the pump radiation created during operation of the device. In order for the pumping process to be effective, the wavelength of the pump radiation here as well as in other embodiments is smaller than the vertical radiation generated by the vertical emitter 1. In some embodiments, the pump radiation layer 8 is co-planar with vertical emitter zone 5. Similarly, in some embodiments, the p-sided sequence of layers 7 is co-planar with Bragg reflector 4 and the n-sided sequence of layers 9 is co-planar with top layer 6.

The p-sided layer sequence 7 and the n-sided layer sequence 9 may include contact layers, coating layers, waveguide layers and barrier layers. The substrate 3, which can be a GaN-substrate, is in some embodiments p-doped like the p-sided sequence of layers 7. The sequence of the p- or n-sided layers 7 and 9 can, of course, also be switched and an n-doped substrate may be used. The exposed surface of the top layer of the device, such as the n-sided sequence of layers 9, and the surface of the substrate 3 facing away from the active pump radiation layer 8 includes a contact metallization for the charge carrier injection into the pump radiation sources 2, which is not shown here.

Applied to the substrate 3 in the area of the vertical emitter 1 is the Bragg reflector 4, that is, a sequence of layers having alternating stacked dielectric layers with different refractive indices. Suitable dielectric materials include $TiO_2$ and $SiO_2$. The Bragg reflector 4 is designed to reflect the vertical radiation emitted by the vertical emitter 1 during the operation of the device.

Located on the Bragg reflector 4 is the active vertical emitter zone 5. In the embodiment shown the vertical emitter zone 5 includes radiation-generating organic material, for example an organic material with low molecular weight, which is also called a low-molecular compound or small-molecule organic material, a polymer or a combination of both of these materials.

Small molecule organic materials are typically applied by thermal evaporation under vacuum conditions. Examples of radiation-generating small molecule organic materials are tris(8-hydroxychinolinato)aluminum (Alq), 1,3-bis(N,N-dimethylaminophenyl)-1,3,4-oxidazole (OXD-8), Oxo-bis (2-methyl-8-chinolinato)aluminum, bis(2-methyl-8-hydroxychinolinato)aluminum; bis(hydroxybenzochinolinato) beryllium ($BeQ_2$), bis(diphenylvinyl)biphenylene (DPVBI), and arylamine-substituted distyrylarylene (DSA-Amine).

Polymers are typically applied by a method called spincasting or spincoating. Alternatively, spatially selective deposition may also be used, such as ink-jet printing. Examples of radiation-generating polymers are poly(p-phenylene-vinylene) and polyarylenevinylene as well as the co-polymers arylene-vinylene-oligomers, polyarylene, polychinoline as well as derivatives and mixtures thereof.

In some embodiments, the vertical emitter zone 5 is not configured as a homogeneous layer but as a sequence of alternately optically active and optically inactive layers. The optically active layers are characterized by high quantum efficiency for a recombination of charge carrier pairs by radiation. The charge carrier pairs are created during the operation of the semiconductor laser device by the optical pumping of the pump radiation from the pump radiation sources 2 that is radiated from the side into the vertical emitter zone 5 and into the optically inactive and/or active layers of the vertical emitter zone.

Applied to the vertical emitter zone 5 is the top layer 6, which is made of a material that can be transparent to the generated vertical emitter radiation, and which typically prevents moisture from entering the vertical emitter zone 5, which in some embodiments includes a hydrophilic material.

For the operation of the semiconductor laser device, the design includes an external, semi-transparent resonator mirror, which is not shown here. The external resonator mirror together with the internal Bragg reflector 4 forms a resonator for the vertical emitter 1.

The semiconductor laser device shown in FIG. 1 can be manufactured by first using an epitaxial process to apply the layer sequence for the pump radiation sources 2 all across the substrate 3. In the next step, the epitaxial sequence of layers is structured by an etching process, for example, resulting in bar-shaped pump radiation sources 2 with spaces between adjacent sources 2 forming openings for the vertical emitters 1 in between the sources 2. In the next step, a coating mask is used during deposition of the Bragg reflectors 4 into the openings between the pump radiation sources. Afterward, in the next step of the process, the vertical emitter zones 5 are applied, for example, by thermal evaporation of select organic materials, and covered with the top layer 6. In the final step, the individual semiconductor laser devices with one or multiple vertical emitters 1 and matching pump radiation sources 2 each are separated and the side surfaces of the pump radiation sources are made reflective or structured in order to create resonators. Alternatively, the reflective surfaces may be created in the wafer or—if elements like retro reflectors with total reflection are used—may not be necessary at all.

Figure 2:
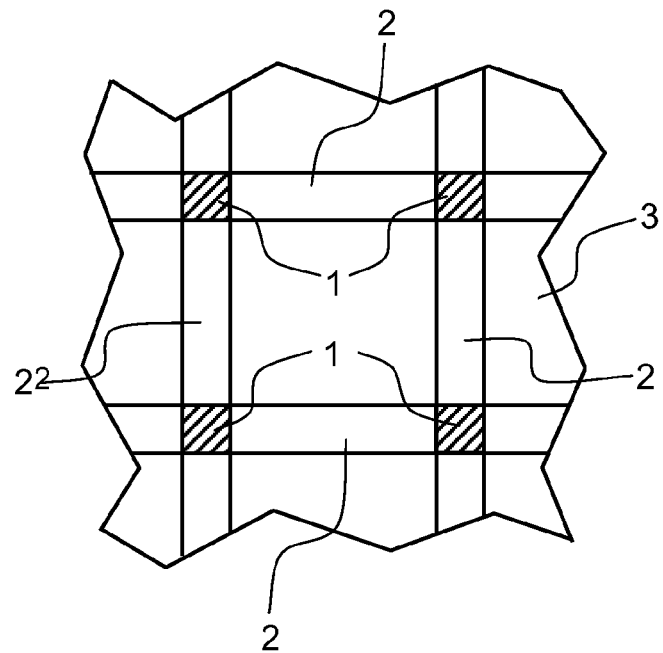
FIG. 2 shows a top view of an embodiment of a semiconductor laser device.

FIG. 2 shows a section of a top view onto a second embodiment of a semiconductor laser device. In this semiconductor laser device, multiple vertical emitters 1 are configured on a substrate 3 in a regular and rectangular pattern. Located between the vertical emitters 1 are the pump radiation sources 2.

Both end surfaces, i.e., surfaces that are adjacent to the vertical emitter 1 of each pump radiation source 2 may be reflective, whereby either one or both end surfaces may be semi-transparent and may function as mirrors for releasing the pump radiation. Each pump radiation source 2 thus constitutes a laser resonator designed for the optical pumping of one or both adjacent vertical emitters 1.

The semiconductor laser device in FIG. 2 acts like a floodlight due to its multiple number of vertical emitters 1 at an accordingly close spacing to the vertical emitters 1. If the pump radiation sources 2 can each be electrically activated separately, then the semiconductor laser device can be used as a display. Multiple colors are possible if vertical emitters 1 with different colors, such as the three basic colors red, green and blue, are used. In this case, the vertical emitters 1 can be in a hexagonal configuration.

Vertical radiation resonators can be created by an external, semi-transparent resonator mirror, positioned parallel to the substrate 3 and also covering the entire area. As an alternative, each vertical emitter 1 may be equipped with an additional internal resonator mirror, which may be designed similar to a Bragg reflector 4.

Figure 3:
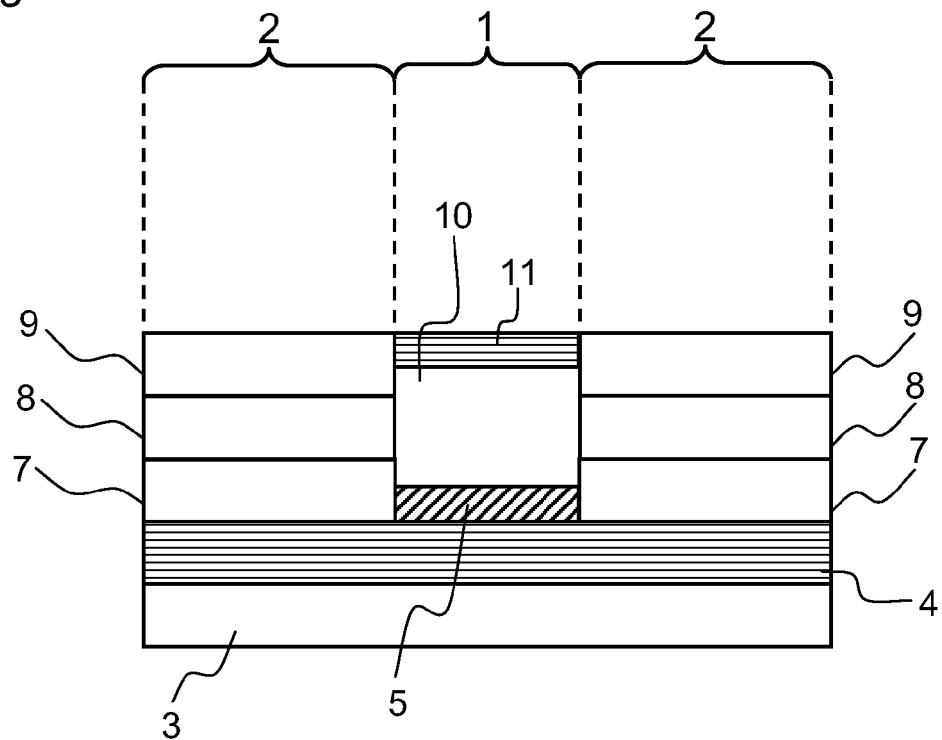
FIG. 3 shows a cross-sectional view of an embodiment of a semiconductor laser device.

FIG. 3 shows a cross-sectional view of another embodiment of a semiconductor laser device. Same elements or elements with the same function are referenced with the same numbers.

The embodiment in FIG. 3 is a semiconductor laser device where an organic vertical emitter 1 is pumped by organic pump radiation sources 2. The vertical emitter 1 as well as the pump radiation sources 2 therefore contain organic material at least in each optically active layer, i.e., in the vertical emitter zone 5 and the pump layer 8. In this case it is advantageous to apply the inorganic Bragg reflector 4 in the first process step all across the substrate 3. Afterwards, the pump radiation sources 2, including the p-sided layer sequence 7, the pump radiation layer 8, and the n-sided layer sequence 9, are applied. While the pump radiation source 2 layers are being applied, masking techniques are used to keep regions free for the vertical emitters 1. Alternatively, the pump radiation sources 2 and the vertical emitter 1 may be applied in reverse order.

Since the layers of the Bragg reflector 4 are usually dielectric, non-conductive layers, no current can be driven into the pump radiation sources 2 through the substrate as was the case for the embodiment in FIG. 1. By adding grooves or trenches into the Bragg reflector 4 with a depth reaching to a current-carrying layer inside the p-sided layer sequence 7 and applying a contact material in this area, current can be introduced into the p-sided layer from the side. This type of current supply can be advantageous when the substrate 3 is made of a non-conductive material like glass, quartz, sapphire, or plastic.

The active vertical emitter zone 5 is applied to the Bragg reflector 4 at a location for the vertical emitter 1. Like the embodiment described in FIG. 1, the vertical emitter zone 5 contains organic semiconductive materials, preferably in the form of stacked layers with alternating layers of optically active and optically inactive materials. Applied to the vertical emitter zone 5 is a wave-guide layer 10, and applied to this layer is an internal resonator mirror 11.

In contrast to FIG. 1, in this embodiment the pump radiation layer 8 and the vertical emitter zone 5 are configured vertically one after the other that is, the pump radiation layer is not co-planar with the vertical emitter zone 5. The pump radiation generated by the pump radiation layer 8 penetrates the wave-guide layer 10 during the operation of the device, propagating laterally and vertically. The wave guide 10 is provided with appropriately dimensioned vertical wave guide properties, thus the active vertical emitter zone 5 can laterally be pumped more than with direct irradiation of the pump radiation into the vertical emitter zone 5 from the side. The wave guide 10 is co-planar with pump radiation layer 8, but is also thicker than the pump radiation layer 8 and in a cross-sectional view has a top surface that is further from the substrate 3 than the top surface of the pump radiation layer 8 and has a bottom surface that is closer to the substrate 3 than the bottom surface of the pump radiation layer 8.

Due to the internal resonator mirror 11, the semiconductor laser device can also be operated without an external resonator. When using an internal resonator mirror the resonator will be shorter than in the case of an external mirror. However, any greater line width of the vertical radiation resulting from a lower resonator length and accordingly a lower Q-factor of the resonator, is negligible for display purposes. The internal resonator mirror 11 can be configured as a dielectric reflector stack in a way analogous to the Bragg reflector 4. The wave-guide layer 10 as well as the internal resonator mirror 11 can include organic layers. It is then not necessary to apply inorganic layers onto organic layers.

Figure 4:
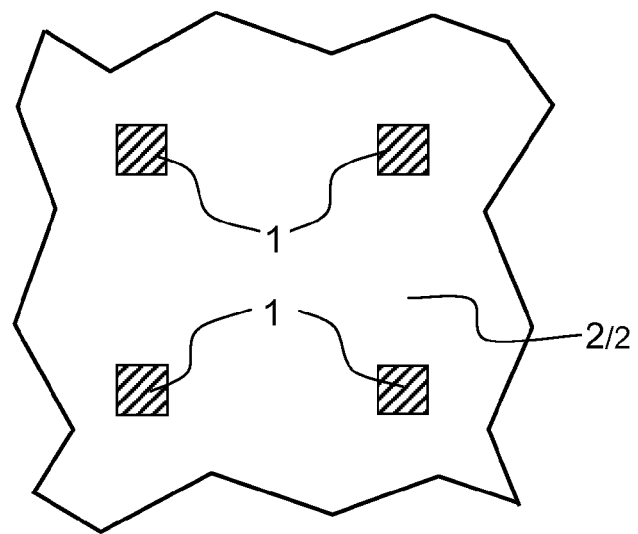
FIG. 4 shows a top view of an embodiment of a semiconductor laser device.

FIG. 4 shows a section of a top view onto a fourth embodiment of a semiconductor laser device. In this semiconductor laser device, multiple vertical emitters 1 are configured in a regular, rectangular pattern on a substrate, which is not visible. In contrast to the semiconductor laser device shown in FIG. 2 showing multiple bar-shaped pump radiation sources 2, this embodiment includes only one continuous pump radiation source.

This type of configuration can be implemented with an organic pump radiation source 2, which may be applied to the substrate by spincasting. The edges of the active layer of the pump radiation source 2 are not made reflective, so that the pump radiation source 2 is not a laser. This notwithstanding, the large area inside the active layer of the pump radiation source 2 generates enough light intensity to optically pump the vertical emitter 2.

Where one component or layer of a device has been described, applicant notes that multiples of the component or layer can be used in its place.

The explanation of the invention by means of the exemplary embodiments is not intended as restriction of the invention to these. Instead, the invention is related to all arrangements having the features mentioned in the claims. Furthermore, the invention comprises all features mentioned in the description and their combination even if these are not explicitly mentioned in the claims or in the description.

The invention claimed is:

1. A semiconductor laser device comprising:
   a substrate (3);
   an optically pumped surface-emitting vertical emitter (1) with a radiation-generating vertical emitter zone (5) on the substrate, wherein the vertical emitter (1) has a layer containing an organic material, wherein the organic material in the layer of the vertical emitter is a first organic material, is capable of generating radiation and is present in the vertical emitter zone (5); and
   a monolithically integrated pump radiation source (2) for the optical pumping of the vertical emitter (1) dimensioned for emission of pump radiation in a main pump radiation direction running transversely to a main radiation direction of vertical radiation from the vertical emitter (1), wherein the pump radiation source includes a second organic material;
   wherein first organic material or the second organic material is a polymer or includes a small molecule organic compound.

2. A semiconductor laser device according to claim 1, wherein an internal resonator mirror is on the vertical emitter zone.

3. A semiconductor laser device according to claim 2, wherein the internal resonator mirror is a Bragg reflector.

4. A semiconductor laser device according to claim 2, wherein the internal resonator mirror is located between the vertical emitter zone (5) and the substrate (3), and the vertical radiation is transmitted in a direction away from the substrate (3).

5. A semiconductor laser device according to claim 2, further comprising an additional internal resonator mirror (11), wherein the additional internal resonator mirror (11) and the internal resonator mirror vertically enclose the vertical emitter zone (5), thus forming a resonator for the vertical radiation, and wherein the additional internal resonator mirror (11) is semi-transparent and is configured to transmit the vertical radiation.

6. A semiconductor laser device according to claim 1, wherein the pump radiation source (2) is an edge-emitting laser.

7. A semiconductor laser device according to claim 1, wherein two pump radiation sources (2) are positioned on opposite sides of the vertical emitter (1), and the two pump radiation sources (2) have a joint resonator and jointly form a laser.

8. A semiconductor laser device according to claim 1, wherein the pump radiation source has one active, radiation-generating pump layer (8), which at least partially overlaps the active vertical emitter zone (5).

9. A semiconductor laser device according to claim 1, wherein the pump radiation source (2) has an active, radiation-generating pumping layer (8), which is located vertically downstream from the vertical emitter zone (5) with respect to a direction radiation is emitted.

10. A semiconductor laser device according to claim 1, wherein the pump radiation source (2) has a sequence of layers based on a group III-V or II-VI semiconductor material.

11. A semiconductor laser device according to claim 1, wherein the organic material is semi-conductive.

12. A semiconductor laser device according to claim 1, wherein the pump radiation source includes semi-conductive organic material.

13. A semiconductor laser device according to claim 1, wherein the wavelength of the pump radiation is shorter that the wavelength of the vertical radiation.

14. A semiconductor laser device according to claim 1, comprising at least two vertical emitters (1) with different wavelengths of vertical radiation.

15. A semiconductor laser device according to claim 1, comprising multiple vertical emitters (1) in an evenly spaced configuration.

16. A method for producing a semiconductor laser device pursuant to claim 1, comprising:
    forming a sequence of epitaxial layers onto a substrate (3) with the expitaxial sequence including a radiation-generating layer and configured to function as a pump radiation source (2);
    creating a recess in the sequence of epitaxial layers;
    forming a sequence of layers in the recess in the sequence of epitaxial layers, wherein the sequence of layers includes a radiation-generating layer and a layer containing an organic material, and the sequence of layers is configured to function as a vertical emitter (1).

17. A method according to claim 16, wherein the radiation-generating layer formed in the recess in the epitaxial layers contains the organic material.

18. A method according to claim 16, wherein creating a recess includes etching the recess.

19. A method according to claim 16, wherein creating a recess includes using a mask on the substrate (3) while applying the sequence of epitaxial layers.

20. A semiconductor laser device comprising:
    a substrate (3);
    an optically pumped surface-emitting vertical emitter (1) with a radiation-generating vertical emitter zone (5) on the substrate, wherein the vertical emitter (1) has a layer containing an organic material;
    a monolithically integrated pump radiation source (2) for the optical pumping of the vertical emitter (1) dimensioned for emission of pump radiation in a main pump radiation direction running transversely to a main radiation direction of vertical radiation from the vertical emitter (1); and
    a second vertical emitter, wherein the vertical emitters are in an evenly spaced configuration.

* * * * *

UNITED STATES PATENT AND TRADEMARK OFFICE
CERTIFICATE OF CORRECTION

PATENT NO. : 7,672,353 B2  Page 1 of 1
APPLICATION NO. : 11/861679
DATED : March 2, 2010
INVENTOR(S) : Marc Philippens It is certified that error appears in the above-identified patent and that said Letters Patent is hereby corrected as shown below:

Column 8, Line 32 at Claim 16; replace:
"with the expitaxial sequence including a radiation-gen-" with
-- with the epitaxial sequence including a radiation-gen- --

Signed and Sealed this

Fourth Day of May, 2010

David J. Kappos
*Director of the United States Patent and Trademark Office*